(12) United States Patent
Hegblom (10) Patent No.: US 11,462,888 B2
(45) Date of Patent: Oct. 4, 2022

(54) EMITTER ARRAY WITH MULTIPLE GROUPS OF INTERSPERSED EMITTERS

(71) Applicant: Lumentum Operations LLC, Milpitas, CA (US)

(72) Inventor: Eric R. Hegblom, Sunnyvale, CA (US)

(73) Assignee: Lumentum Operations LLC, San Jose, CA (US)

( * ) Notice: Subject to any disclaimer, the term of this patent is extended or adjusted under 35 U.S.C. 154(b) by 279 days.

(21) Appl. No.: 16/587,866

(22) Filed: Sep. 30, 2019

(65) Prior Publication Data

US 2020/0119527 A1 Apr. 16, 2020

Related U.S. Application Data

(60) Provisional application No. 62/745,029, filed on Oct. 12, 2018.

(51) Int. Cl.
| | |
|---|---|
| *H01S 5/42* | (2006.01) |
| *H01S 5/042* | (2006.01) |
| *H01S 5/183* | (2006.01) |
| *H01S 5/028* | (2006.01) |
| *H01S 5/02* | (2006.01) |

(52) U.S. Cl.
CPC .......... *H01S 5/423* (2013.01); *H01S 5/04252* (2019.08); *H01S 5/0206* (2013.01); *H01S 5/0282* (2013.01); *H01S 5/18305* (2013.01); *H01S 5/18311* (2013.01); *H01S 5/18313* (2013.01); *H01S 5/18322* (2013.01); *H01S 5/18369* (2013.01); *H01S 5/18394* (2013.01); *H01S 2301/176* (2013.01)

(58) Field of Classification Search
CPC .. H01S 5/40–423; H01S 5/18; H01S 5/18322; H01S 5/18391; H01S 5/18386; H01S 2301/18
See application file for complete search history.

(56) References Cited

U.S. PATENT DOCUMENTS

| | | | | |
|---|---|---|---|---|
| 10,826,278 | B2 * | 11/2020 | Hegblom | H01S 5/423 |
| 2019/0386189 | A1 * | 12/2019 | Lee | H01L 33/08 |
| 2020/0083669 | A1 * | 3/2020 | Na | G01P 13/00 |
| 2021/0075196 | A1 * | 3/2021 | Hegblom | H01S 5/18308 |

FOREIGN PATENT DOCUMENTS

WO WO-2019040506 A1 * 2/2019 ............. H01S 5/423

* cited by examiner

*Primary Examiner* — Tod T Van Roy
*Assistant Examiner* — Delma R Fordé
(74) *Attorney, Agent, or Firm* — Harrity & Harrity, LLP (57) ABSTRACT

An optical device may include an emitter array including a plurality of emitter groups. Each emitter group may be independently addressable from other emitter groups, of the plurality of emitter groups, for independently lasing. Emitters of the plurality of emitter groups may be interspersed within the emitter array such that a minimum emitter-to-emitter distance within the emitter array is less than a minimum emitter-to-emitter distance within any of the emitter groups.

20 Claims, 9 Drawing Sheets

510 — Provide a substrate on which an emitter array is to be formed

520 — Form, after providing the substrate, a first plurality of emitters of the emitter array, a second plurality of emitters of the emitter array, and a third plurality of emitters of the emitter array on or within the substrate such that: the first plurality of emitters are interspersed among the second plurality of emitters, the second plurality of emitters are interspersed among the third plurality of emitters, and the third plurality of emitters are interspersed among the first plurality of emitters, a first minimum emitter-to-emitter distance between any two adjacent emitters of the emitter array is less than a corresponding second minimum emitter-to-emitter distance between two of the first plurality of emitters, two of the second plurality of emitters, or two of the third plurality of emitters, and the first plurality of emitters, the second plurality of emitters, and the third plurality of emitters are electrically isolated from each other for independent lasing 530 — Electrically connect the first plurality of emitters, the second plurality of emitters, and the third plurality of emitters to corresponding electrodes

EMITTER ARRAY WITH MULTIPLE GROUPS OF INTERSPERSED EMITTERS

RELATED APPLICATION

This application claims priority to U.S. Provisional Patent Application No. 62/745,029, filed on Oct. 12, 2018, the content of which is incorporated by reference herein in its entirety.

TECHNICAL FIELD

The present disclosure relates to an emitter array and, more particularly, to an emitter array with multiple groups of interspersed emitters.

BACKGROUND

An emitter can include a vertical-emitting device, such as a vertical cavity surface emitting laser (VCSEL). A VCSEL is a laser in which a beam is emitted in a direction perpendicular to a surface of the VCSEL (e.g., vertically from a surface of the VCSEL). Multiple emitters may be arranged in an emitter array with a common substrate.

SUMMARY

According to some implementations, an optical device may include an emitter array including a plurality of emitter groups, each emitter group being independently addressable from other emitter groups, of the plurality of emitter groups, for independently lasing, and emitters of the plurality of emitter groups being interspersed within the emitter array such that a minimum emitter-to-emitter distance within the emitter array is less than a minimum emitter-to-emitter distance within any of the emitter groups.

According to some implementations, an optical device may include an emitter array including a first plurality of emitters, a second plurality of emitters, and a third plurality of emitters, wherein emitters from the first plurality of emitters the second plurality of emitters, and the third plurality of emitters are interspersed in the emitter array, wherein a first minimum emitter-to-emitter distance between any two adjacent emitters of the emitter array is less than a second minimum emitter-to-emitter distance, the second minimum emitter-to-emitter distance being a minimum emitter-to-emitter distance between any two emitters of the first plurality of emitters, or a minimum emitter-to-emitter distance between any two emitters of the second plurality of emitters, or a minimum emitter-to-emitter distance between any two emitters of the third plurality of emitters, wherein the first plurality of emitters, the second plurality of emitters, and the third plurality of emitters are independently addressable for independent lasing.

According to some possible implementations, a vertical cavity surface emitting laser (VCSEL) array may include at least three groups of VCSELs, wherein VCSELs of a first group of the at least three groups of VCSELs are interspersed among VCSELs of a second group of the at least three groups of VCSELs, the VCSELs of the second group of VCSELs are interspersed among VCSELs of a third group of the at least three groups of VCSELs, and the VCSELs of the third group of the at least three groups of VCSELs are interspersed among the VCSELs of the first group of the at least three groups of VCSELs, wherein a first minimum emitter-to-emitter distance between any two adjacent VCSELs of the at least three groups of VCSELs of the VCSEL array is less than a second minimum emitter-to-emitter distance between two VCSELs of any one of the at least three groups of VCSELs, wherein the VCSEL array is configured such that the at least three groups of VCSELs are capable of lasing independently of each other.

According to some possible implementations, a method may include providing a substrate on which a laser array is to be formed; forming, after providing the substrate, first lasers of the laser array, second lasers of the laser array, and third lasers of the laser array on or within the substrate such that: the first lasers are interspersed among the second lasers, the second lasers are interspersed among the third lasers, and the third lasers are interspersed among the first lasers, a first minimum emitter-to-emitter distance between any two adjacent lasers of the laser array is less than a corresponding second minimum emitter-to-emitter distance between two of the first lasers, two of the second lasers, or two of the third lasers, and the first lasers, the second lasers, and the third lasers are electrically isolated from each other for independent lasing; and electrically connecting the first lasers, the second lasers, and the third lasers to corresponding electrodes.

BRIEF DESCRIPTION OF THE DRAWINGS

FIGS. 2A-4 are diagrams depicting one or more example implementations described herein.

DETAILED DESCRIPTION

The following detailed description of example implementations refers to the accompanying drawings. The same reference numbers in different drawings may identify the same or similar elements.

Figure 6:
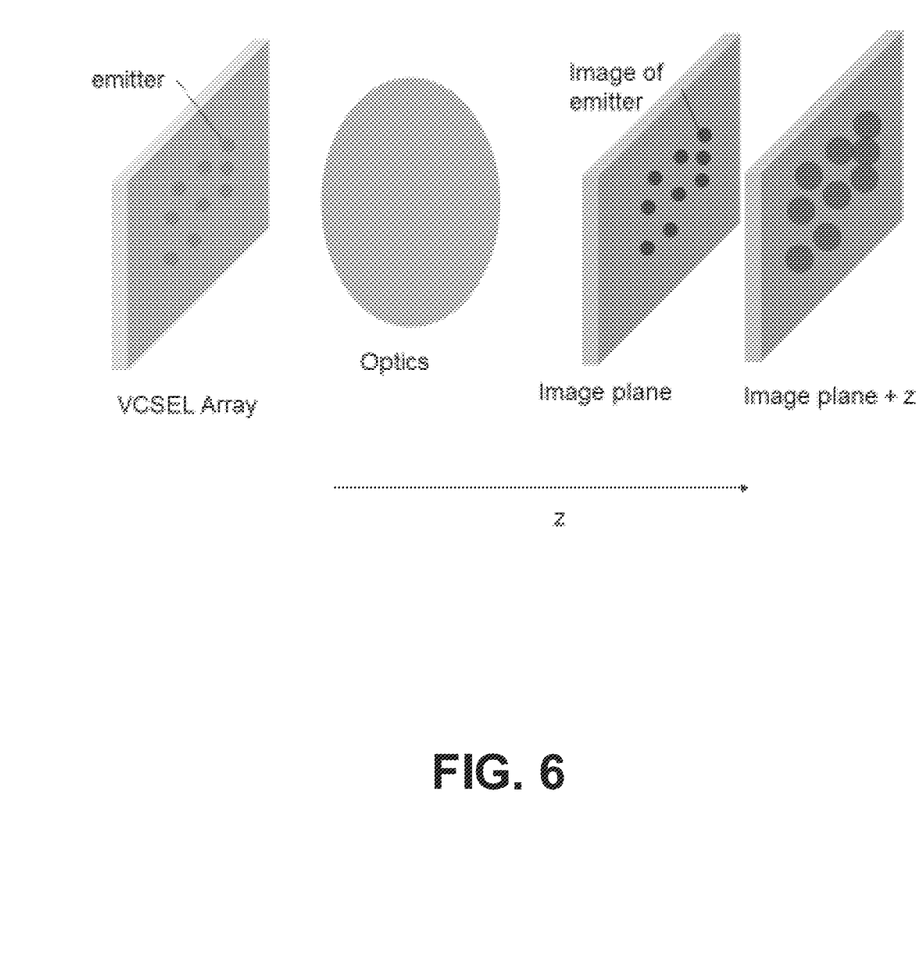
FIG. 6 is a diagram of an example illustrating principles of depth-of-field of an emitter array.

When emitter arrays are used for structured-light three-dimensional (3D) sensing, a manufacturer may want to pack more emitters onto a single die. However, for some 3D sensing systems it is necessary to distinguish individual emitters projected into a scene. The light from the emitters may be projected through lenses and or other optics and come into focus again at an image plane. At the image plane, the emitters will appear separated in proportion to their displacement on the die. However, at depths closer or further from the image plane (e.g., a z-direction), the projected size of the emitters will increase and eventually they will merge into each other. FIG. 6 is a diagram illustrating these principles of depth-of-field of an emitter array. For the system to function over a wide variation in depth, the beam divergence needs to be sufficiently small and there needs to be sufficient separation between emitters so there is a sufficient depth-of-field from the image plane where it is possible to distinguish individual emitters. As emitters are more closely spaced, emission areas of the emitters must be reduced correspondingly to avoid overlap of the emission areas too near to the image plane even though the emission areas may not overlap on the chip itself. Furthermore, with a smaller emission area, variation in a diameter or a size (e.g., an optical aperture) of the emitters needs to be reduced in order to maintain a fixed percentage error (e.g., less than +/−20 percent) in current density and output power of individual emitters (which are typically driven in parallel from a single contact). Reducing a diameter and/or size of emitters of an emitter array results in reduced process yield. This tradeoff between emitter size and yield normally limits the emitter spacing on the chip. This invention provides a chip design to overcome this limitation.

Some implementations described herein provide an emitter array with multiple groups of interspersed emitters (e.g., chosen to permit larger emitter sizes with a smaller fabrication spacing and/or a wider range of depth of sensing than otherwise possible with a single group of emitters used in a 3D sensing system). For example, some implementations described herein provide an emitter array with interspersed groups of emitters arranged so that a minimum emitter-to-emitter (e.g., center-to-center distance or spacing) between proximate emitters within each group is substantially larger than a minimum emitter-to-emitter distance between adjacent emitters of the emitter array.

Specifically, some implementations described herein provide for larger emitters with larger variation in aperture sized in high density configurations and/or provide for sensing over a longer depth of field, as compared to emitters used in conventional high density emitter arrays for structured light. For example, a conventional emitter array with a minimum emitter-to-emitter distance of 24 microns ($\mu m$) may need emitter apertures with a diameter of 7 $\mu m$ in order to avoid overlap of projected spots of adjacent emitters near (e.g., 5 centimeters (cm) away from) an image plane. To ensure that optical power and operating current density do not vary more than, for example, +/−20 percent, the emitter size variation may need to be less than +/−10 percent or +/−0.7 $\mu m$. Such a small permissible emitter size variation may decrease yield.

Some implementations described herein, and with respect to the example described above, may facilitate use of emitters patterned with a minimum distance of 24 $\mu m$, but with a size greater than 7 $\mu m$ (for example, 12 $\mu m$), and a tolerance on the aperture size of +/−1.2 $\mu m$ (approximately +/−10 percent of the example emitter size) to ensure that the current density and optical power variation is less than +/−20 percent, and so that emission spots from adjacent emitters do not appreciably overlap within a given distance from an image plane. Such a larger permissible emitter size variation may increase yield. Additionally, or alternatively, some implementations described herein provide for use of an emitter array with the same minimum distance between emitters (e.g., but having an intermediate size of, for example, 10 $\mu m$) while extending the depth of field beyond, for example, 5 cm from the image plane (e.g., to 8 cm) with respect to overlap of emission spots for adjacent emitters.

Figure 1A:
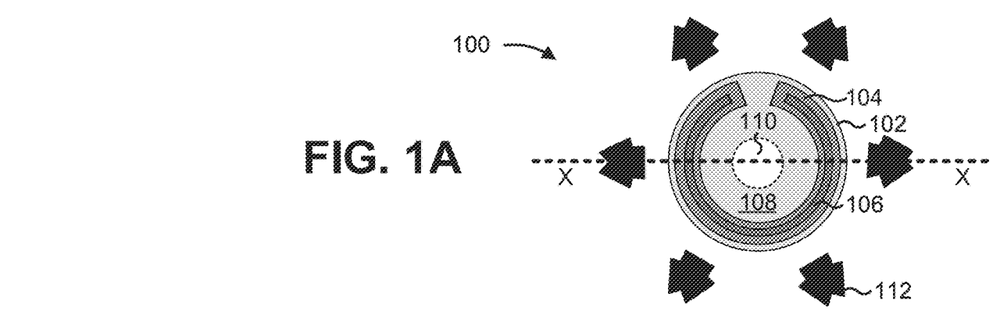
FIGS. 1A and 1B are diagrams depicting a top-view of an example vertical-emitting device and a cross-sectional view of the example vertical-emitting device, respectively.
Figure 1B:
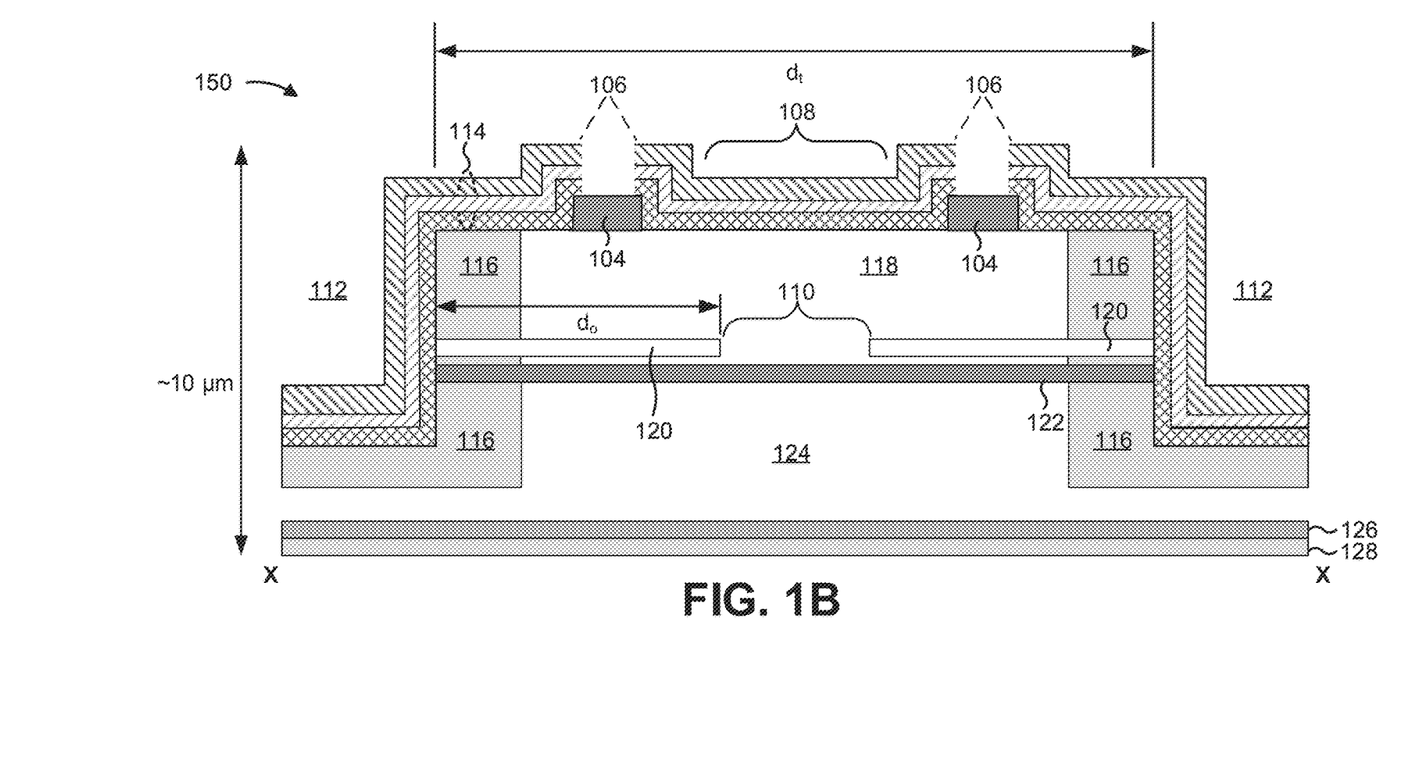

FIGS. 1A and 1B are diagrams depicting a top-view of an example emitter 100 and a cross-sectional view 150 of example emitter 100 along the line X-X, respectively. As shown in FIG. 1A, emitter 100 may include a set of emitter layers constructed in an emitter architecture. In some implementations, emitter 100 may correspond to one or more vertical-emitting devices described herein.

As shown in FIG. 1A, emitter 100 may include an implant protection layer 102 that is circular in shape, in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g. a dielectric layer, a passivation layer, and/or the like) of emitter 100 and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium grey area shows an area of ohmic metal layer 104 that is covered by the protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are possible, such as a compact emitter that includes five trenches 112, seven trenches 112, and/or the like. In some implementations, trench 112 may encircle emitter 100 to form a mesa structure $d_t$ (see FIG. 1B). As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100.

Notably, while the design of emitter 100 is described as including a VCSEL, other implementations are possible. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, emission profile, and/or the like. In other words, emitter 100 is not particular to an emitter with a given performance characteristic.

The example cross-sectional view shown in FIG. 1B may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g. a dielectric passivation/mirror layer), and an ohmic metal layer 104. As shown, emitter 100 may have, for example, a total height that is approximately 10 μm.

Backside cathode layer 128 may include a layer that makes electrical contact with substrate layer 126. For example, backside cathode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a GaAs layer, an InP layer, and/or the like.

Bottom mirror 124 may include a bottom reflector layer of emitter 100. For example, bottom mirror 124 may include a distributed Bragg reflector (DBR). Bottom mirror 124 is shown as the white area beneath active region 122 between the left and right portions of isolation material 116.

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as $d_o$ in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, a lithographically defined intra-cavity mesa and regrowth, or the like.

Top mirror 118 may include a top reflector layer of emitter 100. For example, top mirror 118 may include a DBR. Top mirror 118 is shown as the white area above oxidation layer 120 between the left and right portions of isolation material 116.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a $SiO_2$ layer, a $Si_3N_4$ layer, an $Al_2O_3$ layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, and/or the like. Selection of a particular type of ohmic metal layer 104 may depend on the architecture of the emitters. Ohmic metal layer 104 may provide ohmic contact between a metal and a semiconductor and/or may provide a non-rectifying electrical junction and/or may provide a low-resistance contact.

In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100 and any layer may comprise more than one layer.

Figure 2A:
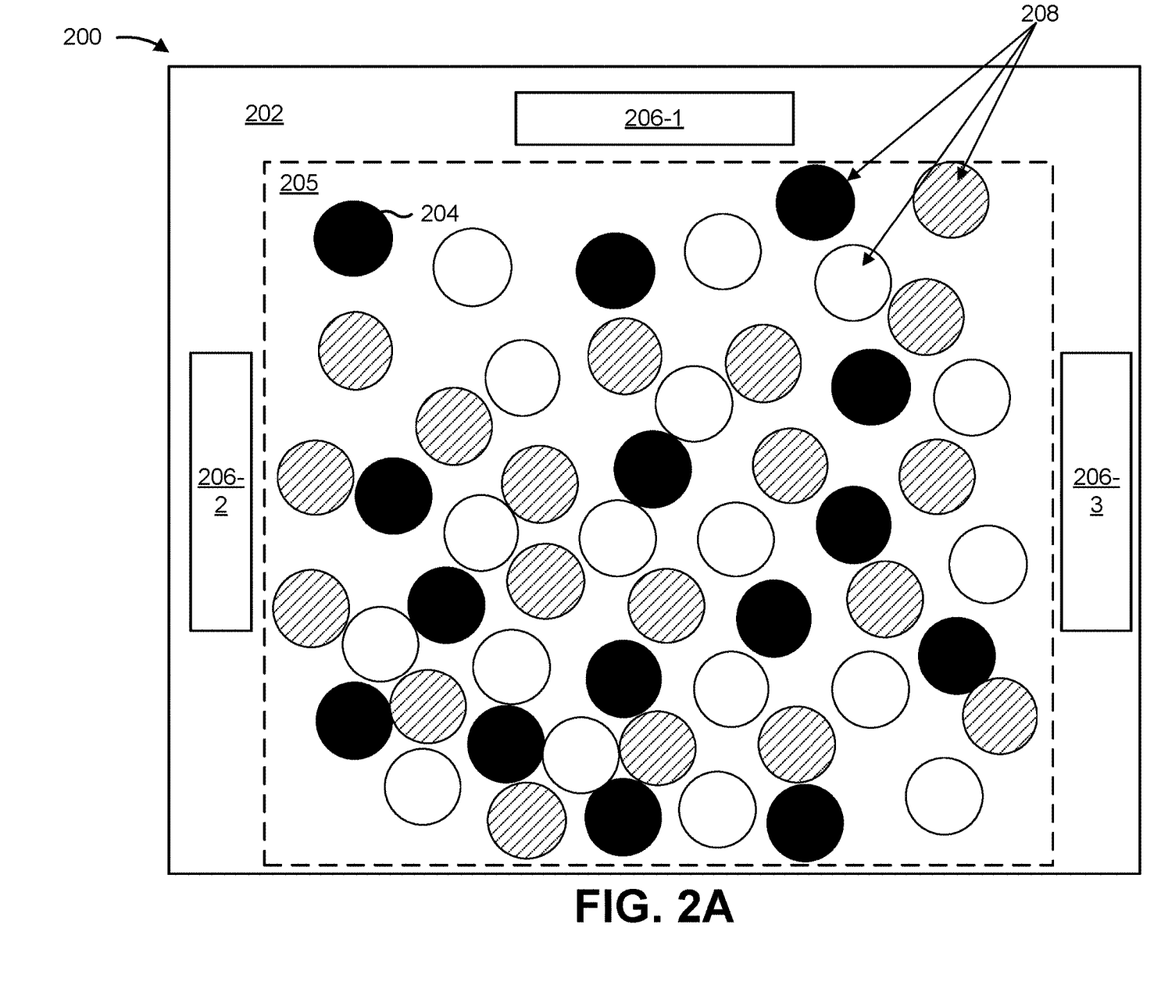

FIGS. 2A-2D are diagrams depicting one or more example implementations 200 described herein. FIG. 2A shows a die 202 (e.g., a chip, a portion of a wafer, and/or the like) on which an emitter array has been formed. For example, and as described below, the emitter array may be an emitter array with multiple groups of interspersed emitters. Notably, while some example implementations described herein are described in the context of an emitter array that emits light through an epitaxial side of the chip (top-emitting), the techniques and apparatuses described herein are applicable to emitter arrays that emit light which travels through the substrate and out the opposite side of the die (bottom-emitting).

As shown in FIG. 2A, the emitter array includes various emitters 204 (shown as black, white, and striped circles). For example, an emitter 204 may include a laser, a vertical-cavity surface-emitting laser (VCSEL), a vertical external-cavity surface-emitting laser (VECSEL), a light-emitting diode (LED), an optical device, and/or the like. Emitters 204 may each be included in one of multiple groups 205 of emitters 204. For example, the emitters 204 shown by black circles may be a first group 205-1 of emitters 204, the emitters 204 shown by white circles may be a second group 205-2 of emitters 204, and the emitters 204 shown by striped circles may be a third group 205-3 of emitters 204. The various groups 205 of emitters 204 are described in more detail below.

As shown in FIG. 2A, die 202 may include multiple electrodes 206 (e.g., shown as electrodes 206-1 through 206-3) to provide electrical power to emitters 204 of the emitter array on die 202. Additional electrodes may be located on the opposite side of the die 202. Each electrode 206 may be an anode or a cathode. Electrodes 206 may provide electrical connection, respectively, to different groups 205-X (where X is the index of a group of emitters 204) of emitters 204 of the emitter array. For example, electrode 206-1 may provide electrical connection to a first group 205-1 of emitters 204, electrode 206-2 may provide electrical connection to a second group 205-2 of emitters 204, and electrode 206-3 may provide electrical connection to a third group 205-3 of emitters 204. An electrode 206 may also provide electrical connection to more than one group 205 of emitters 204 (e.g., as a common cathode or a shared electrode). An electrode 206 may provide electrical power (or current) to a specific group 205-X of emitters 204 and not to other groups 205-Y, 205-Z of emitters 204 (where Y and Z denote the index of groups other than X). For example, electrode 206-1 may provide electrical power to the first group 205-1 of emitters 204 and may not provide electrical power to other groups 205-1, 205-2 of emitters 204.

Different groups 205 of emitters 204 may be independently addressable for independent lasing during operation. For example, a first group 205-1 of emitters 204 may be independently addressable for lasing independently from other groups 205-2, 205-3 of emitters 204 formed on die 202 (e.g., the first group 205-1 of emitters 204 may be powered and/or may lase independently from the second group 205-2 of emitters 204 and the third group 205-3 of emitters 204, and/or the like). Independent addressability may be based on separate electrical connections respectively between individual electrodes 206-1, 206-2, 206-3 and specific groups 205-1, 205-2, 205-3 of emitters 204, as described in more detail elsewhere herein.

As shown by reference number 208, emitters from different groups of emitters 204 may be interspersed among each other. For example, an emitter 204 from a 205-1 group of emitters 204 may be adjacent to one or more emitters from one or more other groups 205-2, 205-3 of emitters 204. Continuing with the previous example, and referring to the specific emitters 204 shown by reference number 208, an emitter 204 from the first group 205-1 of emitters 204 (shown as the black circle with respect to reference number 208) is adjacent to two emitters 204 from the second group 205-2 of emitters 204 (shown as the two white circles adjacent to the black circle, one of which is shown in connection with reference number 208) and an emitter 204 from the third group 205-3 of emitters 204 (shown as a striped circle adjacent to the black circle, also shown in connection with reference number 208).

A first minimum emitter-to-emitter distance (also referred to herein as a "global minimum emitter-to-emitter distance") between two adjacent emitters 204 of the emitter array 205 may be less than a corresponding second minimum emitter-to-emitter distance (also referred to herein as a "minimum intra-group emitter-to-emitter distance") between two emitters 204 of the first group 205-1 of emitters 204, two emitters 204 of the second group 205-2 of emitters 204, or two emitters 204 of the third group 205-3 of emitters 204. For example, a first minimum emitter-to-emitter distance between the black emitter 204 (from the first group 205-1 of emitters 204) shown with respect to reference number 208 and a white emitter 204 (from the second group 205-2 of emitters 204) or a striped emitter 204 (from the third group 205-3 of emitters 204) may be less than a second minimum emitter-to-emitter distance between two proximate black emitters 204 of the group 205-1 of emitter array. In other words, a first a global minimum emitter-to-emitter distance of the set of emitters 205 between two adjacent emitters 204 which may be of different 205-X, 205-Y groups of emitters 204 may be less than a second minimum emitter-to-emitter distance between two proximate emitters 204 of the same 205-X group of emitters 204. As will be described below, two emitters 204 from a same group 205-X of emitters 204 may be proximate in the context of the same group of emitters 204 (e.g., a first emitter 204 is proximate to a second emitter 204 in the context of a group 205-X of emitters 204 if the first emitter 204 and the second emitter 204 are in the same 205-X group of emitters 204, and the first emitter 204 is the nearest neighbor in that group to the second emitter 204, or vice versa, even though one or more other emitters 204 included in one or more other groups 205-Y, 205-Z of emitters 204 are between the first emitter 204 and the second emitter 204). Y and Z denote the index of groups other than X.

A product of the global minimum emitter-to-emitter distance and a value equal to at least a square root of 2 may be less than the minimum intra-group emitter-to-emitter-distance for a group of emitters 204. In other words, the minimum intra-group emitter-to-emitter-distance may be greater than a square root of two times the global minimum emitter-to-emitter distance. In this way, emitters 204 in the set of all groups 205 of emitters 204 may be spaced closer to each other than two emitters 204 of a same group 205-X of emitters 204. Additionally, or alternatively, the difference in intra-group (e.g., within a group) and global minimum emitter-to-emitter distances facilitates increased emitter size for a given area of die 202 (e.g., larger aperture diameter) relative to conventional emitter arrays, thereby facilitating wider manufacturing tolerances for dies 202, and consequently lower chip costs through a higher yield rate.

In operation, an emission pattern of emitters 204 of the emitter array is projected (and possibly repeated in multiple patterns) through optics into a scene. The scene may contain various surfaces and projecting the patterns of dots is done to measure the 3D profile of these surfaces. The emission pattern of spots comes into focus on an image plane somewhere in the scene. Not all surfaces of interest will be located precisely at the image plane, but may be near the image plane. At the image plane, spots (i.e., images of the emitters 204) are their smallest and, at comparatively further distances from the image plane, will be comparatively larger in size (and also closer together). This variation in size and spacing permits assessment of depth of various surfaces in the scene. However, at some distance from the image plane, the spots of the emission pattern will begin to merge into one another and individual dots will no longer be discernable and sensing of depth will not be possible. Thus, there is a range along an axis perpendicular to the image plane over which sensing depth is possible. This range is referred to herein as a sensor depth-of-field. A sch The minimum emitter-to-emitter distance for a particular group, 205-X, of emitters 204 may be selected to avoid overlap of emission spots at a particular depth of field (distance from the image plane) when light from the emitters 204 of that group 205-X are projected into a scene. For example, by maintaining a minimum emitter-to-emitter spacing between the closest emitters 204 from a particular group 205-X of emitters 204, the configuration of 205-X emitters 204 described herein may avoid overlap between the proximate emitters 204 at a particular distance from the image plane (or depth-of-field) when only group 205-X is used to illuminate a scene at a particular time. An emitter-to-emitter distance may refer to one or more of various manners of evaluating a distance (or spacing) between emitters 204. For example, an emitter-to-emitter distance may be center-to-center spacing, a distance between optical apertures of two emitters 204 (e.g., a center-to-center distance), a distance between oxide trenches of two emitters 204 (e.g., a trench-to-trench distance), and/or the like.

In FIG. 2A, the emitter array has a random pattern of emitters 204 formed from the first group 205-1 of emitters 204, the second group 205-2 of emitters 204, and the third group 205-3 of emitters 204. As a result, the emitter array may emit a random pattern of spots when all three groups of emitters 204 are lasing at the same time. Specific patterns of the different groups of emitters 204 of the emitter array are described below in connection with FIGS. 2B-2D, and other patterns of emitters 204 of an emitter array are shown in and described below with respect to FIGS. 3 and 4.

Figure 2B:
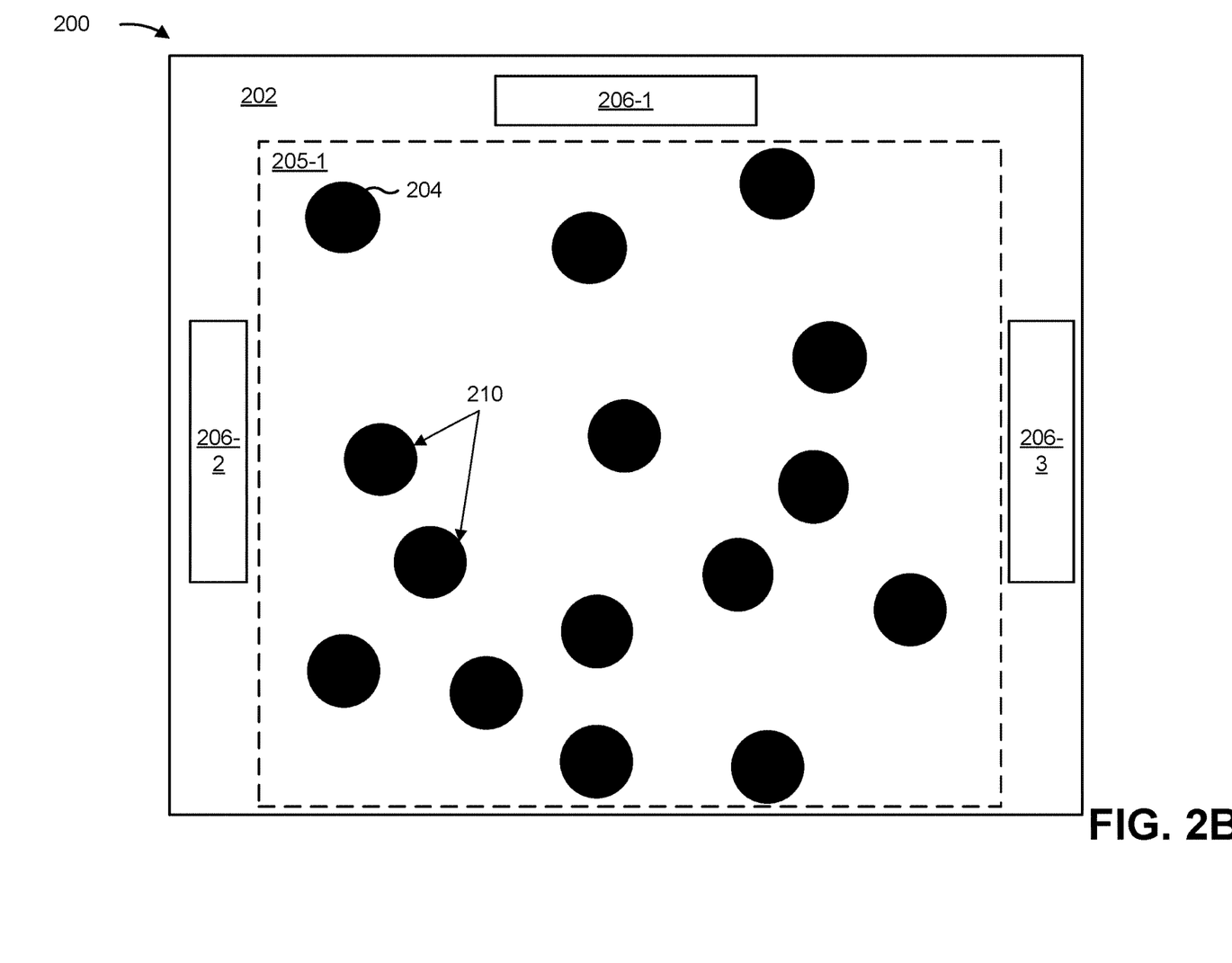

FIG. 2B shows the first group 205-1 of emitters 204 of the emitter array of die 202 shown in FIG. 2A without showing the second group 205-2 of emitters 204 (white circles from FIG. 2A) or the third group 205-3 of emitters 204 (striped circles from FIG. 2A). As shown in FIG. 2B, emitters 204 of the first group 205-1 of emitters 204 are arranged in a random pattern of emitters 204. A random pattern of emitters 204 is a pattern of emitters 204 without a particular or discernable organization or order (i.e., that is not able to be predicted) Reference number 210 shows two adjacent emitters 204 of the first group 205-1 of emitters 204 that are separated by a second minimum emitter-to-emitter distance (e.g., a minimum intra-group emitter-to-emitter distance) of the first group 205-1 of emitters 204. As described elsewhere herein, this second minimum emitter-to-emitter distance may be greater than a first minimum emitter-to-emitter distance between adjacent emitters 204 of different groups 205 of emitters 204 of the emitter array (e.g., any emitters 204 in the emitter array). As a result, when light from only the first group 205-1 of emitters 204 is projected into a scene, the distance from the image plane where the emitters overlap (referred to here as the depth-of-field) may be greater than the depth-of-field when light from all emitters 204 is projected into a scene.

Figure 2C:
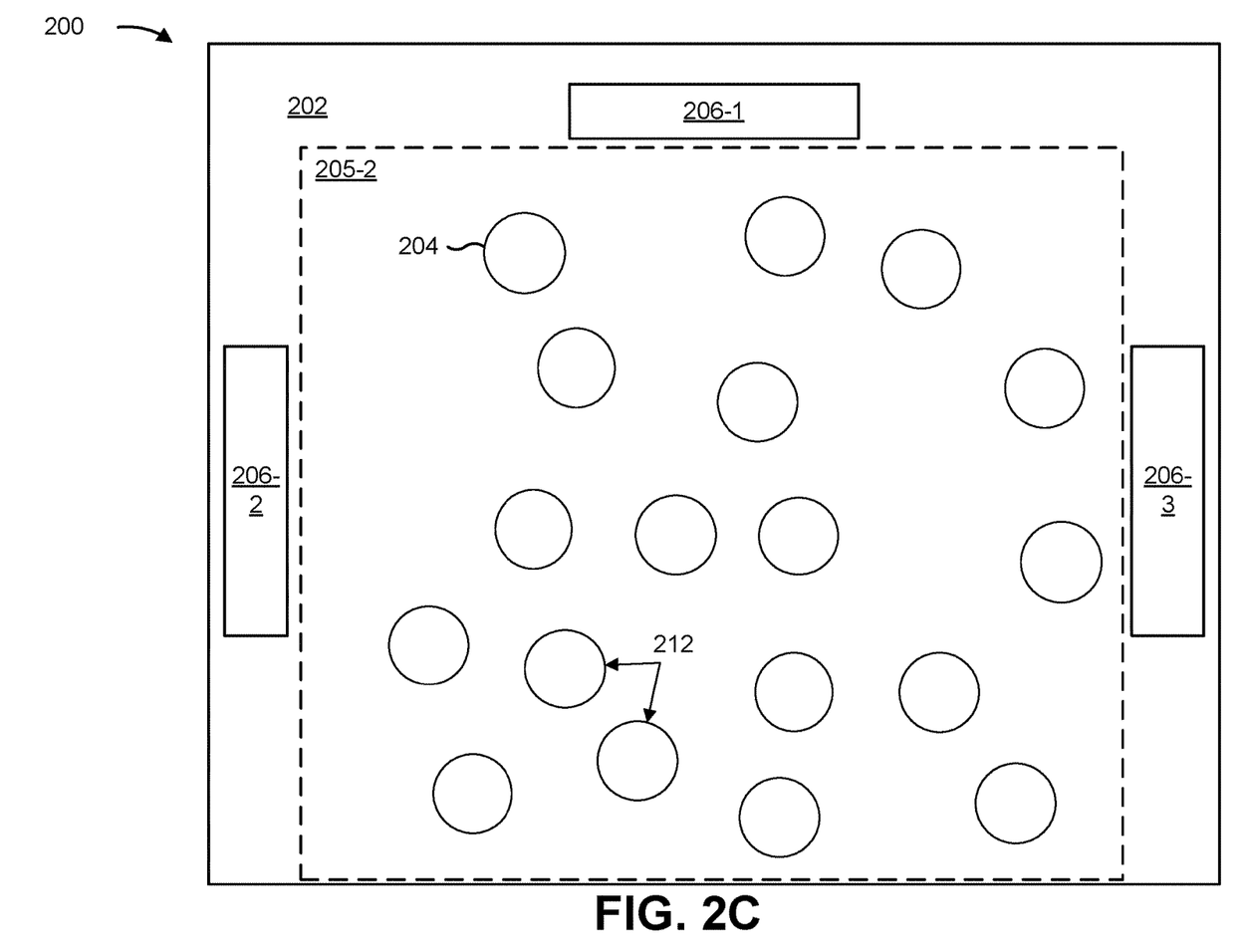

FIG. 2C shows the second group of emitters 204 of the emitter array of die 202 shown in FIG. 2A without showing the first group of emitters 204 (black circles from FIG. 2A) or the third group of emitters 204 (striped circles from FIG. 2A). As shown in FIG. 2C, emitters 204 of the second group of emitters 204 are arranged in a random pattern of emitters 204. Reference number 212 shows an example corresponding second minimum emitter-to-emitter distance between two adjacent emitters 204 of the second group of emitters 204. As described elsewhere herein, this corresponding second minimum emitter-to-emitter distance may be greater than a first minimum emitter-to-emitter distance between adjacent emitters 204 of different groups of emitters 204 of the emitter array. As a result, when lasing, the second group of emitters 204 may have a depth of field that is greater than an array that had emitters sized to avoid overlap when all emitters are lasing.

Figure 2D:
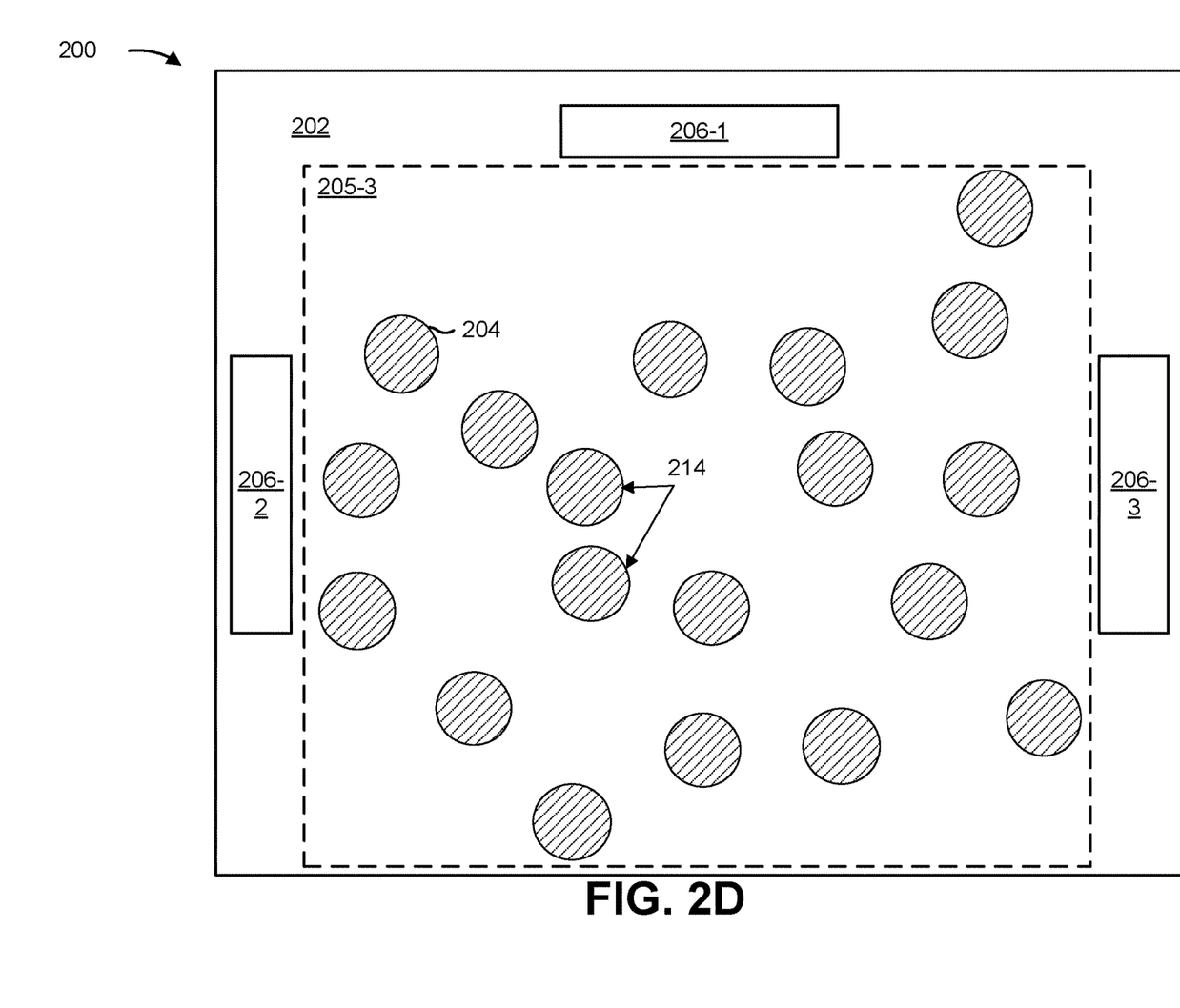

FIG. 2D shows the third group of emitters 204 of the emitter array of die 202 shown in FIG. 2A without showing the first group of emitters 204 (black circles from FIG. 2A) or the second group of emitters 204 (white circles from FIG. 2A). As shown in FIG. 2D, emitters 204 of the third group of emitters 204 are arranged in a random pattern of emitters 204. Reference number 214 shows an example corresponding second minimum emitter-to-emitter distance between two adjacent emitters 204 of the third group of emitters 204. As described elsewhere herein, this corresponding second minimum emitter-to-emitter distance may be greater than a first minimum emitter-to-emitter distance between adjacent emitters 204 of different groups of emitters 204 of the emitter array. As a result, when lasing, the third group of emitters 204 may have a depth of field that is greater than the depth of field when all emitters are lasing.

As described with regard to FIGS. 2B-2D, the first group of emitters 204, the second group of emitters 204, and the third group of emitters 204 may be each arranged in a random pattern of emitters. In addition, as described in connection with FIG. 2A, the emitter array overall may have a random pattern of emitters 204. In this way, the emitter array may have a random pattern of emitters formed from random patterns of emitters corresponding to the first group of emitters 204, the second group of emitters 204, and the third group of emitters 204. In addition, as shown in FIGS. 2B-2D, the different groups of emitters 204 that comprise the emitter array may have different random patterns of emitters 204. This reduces or eliminates sensing issues that would otherwise occur from the different groups of emitters 204 having a same pattern of emitters 204 if the groups were lasing at the same time.

In this way, some implementations described herein provide a die 202 that includes multiple groups of emitters 204 and electrodes 206 to provide electrical connections to to the multiple groups of emitters 204. For example, the electrodes 206 may be configured to independently electrically power the corresponding groups of emitters 204. In addition, a first minimum emitter-to-emitter distance between two adjacent emitters (e.g., adjacent emitters 204 that are included in different groups of emitters 204) of an emitter array formed from the multiple groups of emitters 204 may be less than a second minimum emitter-to-emitter distance between two emitters of a group of emitters 204. For example, a product of the first minimum emitter-to-emitter distance and a square root of two may be less than the second minimum emitter-to-emitter distance. This configuration of die 202 facilitates closer packing of larger emitters 204 on die 202 while reducing or eliminating overlap of emission spots at a depth of field relative to conventional emitter arrays. For example, the first minimum emitter-to-emitter distance may facilitate closer packing of emitters 204. In addition, independent and separate lasing of different groups of emitters 204 in combination with the corresponding second minimum emitter-to-emitter distance may reduce or eliminate overlap of emission spots at a depth of field. Reducing or eliminating overlap of emission spots at a depth of field may increase a depth of field of an emitter array (e.g., by increasing an image depth at which emission spots of the emitter array begin to overlap) relative to conventional emitter arrays. In addition, reducing or eliminating overlap of emission spots at a depth of field may improve optical resolution at the depth of field.

As indicated above, FIGS. 2A-2D are provided merely as one or more examples. Other examples may differ from what is described with regard to FIGS. 2A-2D. For example, although three different groups of emitters 204 were shown in, and described with respect to, FIGS. 2A-2D, other example implementations may have different quantities of groups of emitters 204.

Figure 3:
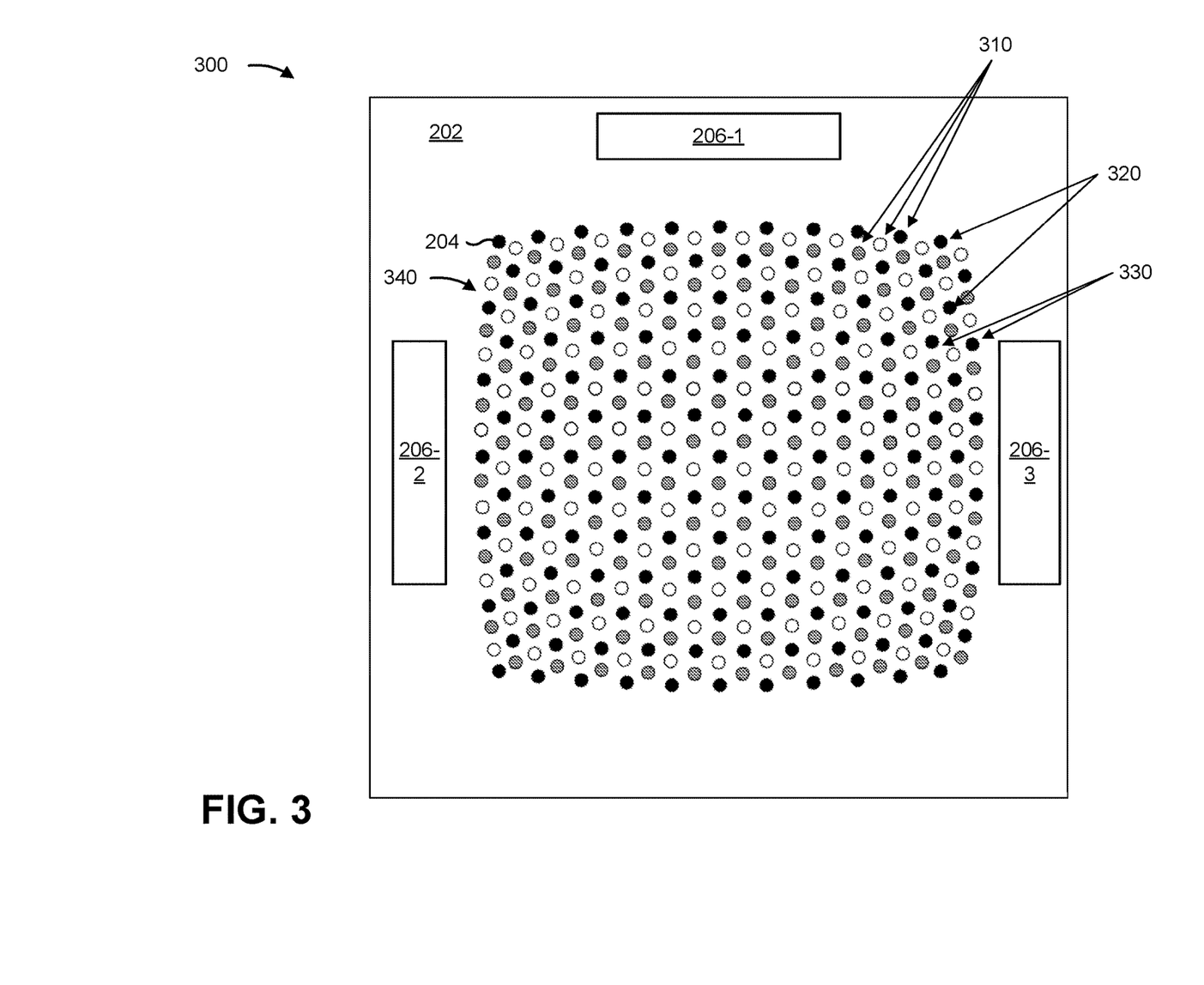

FIG. 3 is a diagram depicting an example implementation 300 described herein. FIG. 3 shows an example configuration of an emitter array on a die 202, similar to that described elsewhere herein. For example, the emitter array may include multiple groups of emitters 204 interspersed with each other and electrodes 206 to provide electrical connections to the multiple groups of emitters 204, similar to that described elsewhere herein. The irregular pattern of emitters 204 within each group may be helpful to locate the pattern when multiple copies of a particular group of emitters 204 is projected into a scene. Typically, 3D sensing with structured-light cannot use uniform patterns of spots.

As shown by reference number 310, the emitter array may include, for example, three groups of emitters 204. For example, the three groups of emitters 204 may include a first group of emitters 204 shown by the black circles, a second group of emitters 204 shown by the white circles, and a third group of emitters 204 shown by the striped/shaded circles. As further shown in FIG. 3, the multiple groups of emitters 204 may be arranged in corresponding non-random patterns. A non-random pattern of emitters 204 is a pattern of emitters with a particular organization or order. For example, a non-random pattern may include a grid pattern, a hexagonal pattern, a known curve pattern, a parabolic pattern, and/or another type of organized or ordered pattern formed from emitters 204. For example, and with respect to the first group of (black) emitters 204, emitters 204 of the first group of emitters 204 may be arranged in a two-dimensional pattern of columns (shown by reference number 320) and rows (shown by reference number 330).

As further shown in FIG. 3, in some implementations, the first group of emitters 204 may have irregular spacing between emitters 204 of the first group of emitters 204. That is, emitter-to-emitter distances between pairs emitters 204 in the first group of emitters 204 may differ among pairs of emitters 204 in the first group of emitters 204. For example, a spacing between a first emitter 204, included in the first group of emitters 204. and a second emitter 204, included in the first group of emitters 204, that is proximate to the first emitter 204 may be different than a spacing between the first emitter 204 and a third emitter 204, included in the first group of emitters 204, that is proximate to the first emitter 204. The second group of emitters 204 and the third group of emitters 204 may be arranged in a manner similar to that described with regard to the first group of emitters 204. In some implementations, a group of emitters 204 may have regular spacing between emitters 204 of the group of emitters 204. That is, emitter-to-emitter distances between pairs emitters 204 in the first group of emitters 204 may be the same among pairs of emitters 204 in the group of emitters 204.

As shown by reference number 340, the emitter array on die 202 may have a non-random pattern of emitters 204 formed from the multiple groups of emitters 204. For example, the emitter array may have a non-random two-dimensional pattern of emitters 204, where emitters 204 of the emitter array are formed in rows and columns of emitters 204. In addition, similar to the multiple groups of emitters 204, emitters 204 of the emitter array may have an irregular spacing between emitters 204 of the emitter array.

As indicated above, FIG. 3 is provided merely as one or more examples. Other examples may differ from what is described with regard to FIG. 3.

Figure 4:
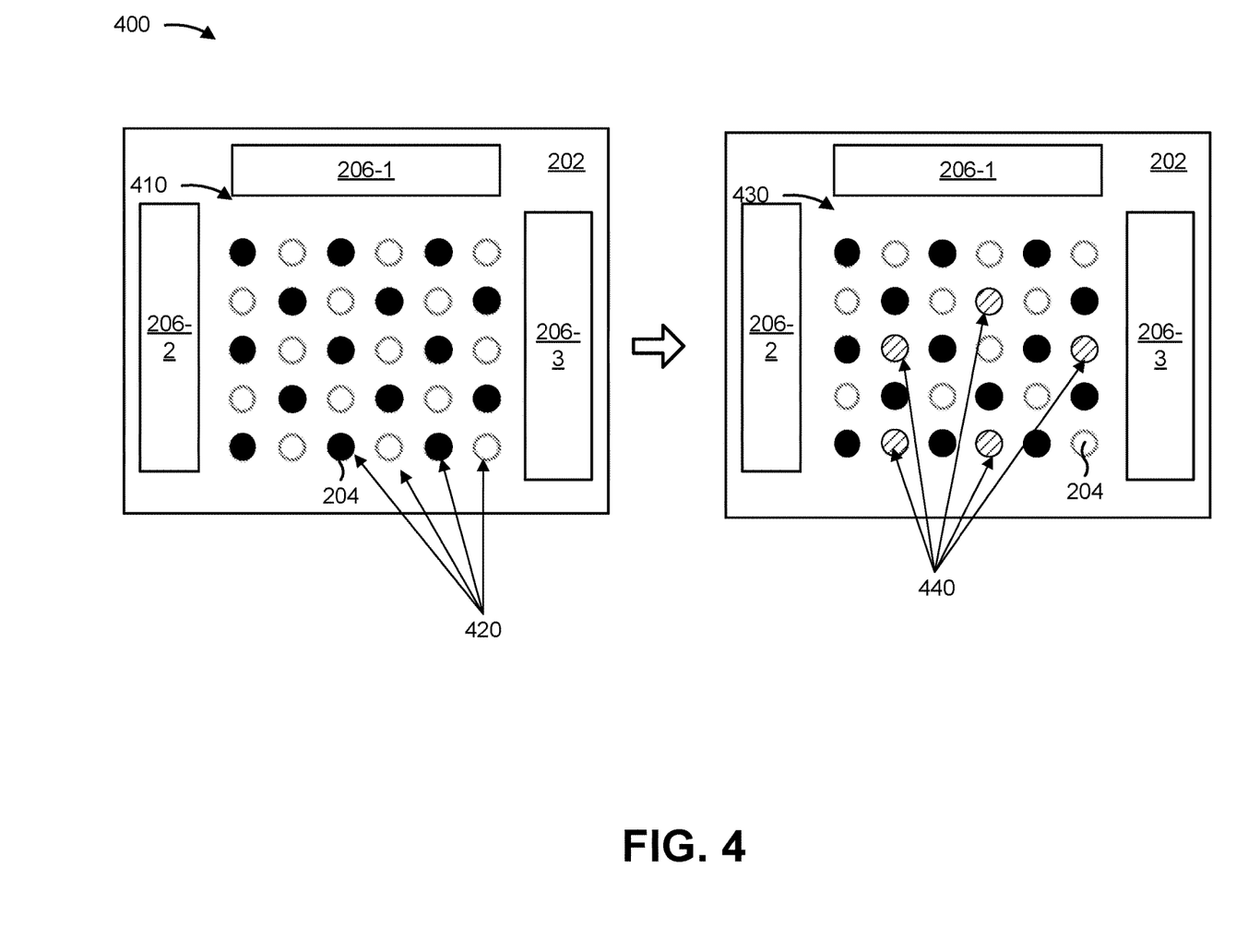

FIG. 4 is a diagram depicting an example implementation 400 described herein. FIG. 4 shows an example configuration of an emitter array on die 202, similar to that described elsewhere herein. For example, the emitter array may include multiple groups of emitters 204 interspersed with each other and electrodes 206 corresponding to the multiple groups of emitters 204, similar to that described elsewhere herein. In addition, FIG. 4 shows a manner in which a uniform, non-random pattern of emitters 204 for an emitter array can be formed from multiple groups of emitters 204 that have corresponding non-uniform patterns of emitters 204.

Reference number 410 shows an emitter array that includes two groups of emitters 204. The two groups of emitters 204 are shown by the black circles and the white circles. As shown by reference number 420, the emitters 204 may be in a non-random pattern of alternating emitters 204 (e.g., on a per-row and a per-column basis).

Reference number 430 shows an emitter array that includes three groups of emitters 204, where the three groups of emitters 204 have corresponding non-uniform patterns of emitters 204. A non-uniform pattern of emitters 204 is a pattern of emitters 204 selected from a non-random pattern of emitters 204 such that the selected emitters have no discernable pattern, as described below. As shown by reference number 440, to form the emitter array that has a non-random pattern of emitters 204 formed from multiple groups of emitters 204 that have corresponding non-uniform patterns of emitters 204, a third group of emitters 204 (shown by the striped circles) may be selected from the first group of emitters 204 and/or the second group of emitters 204 described with respect to the emitter array shown by reference number 410.

As further shown by reference number 440, emitters 204 selected for the third group of emitters 204 may form a non-uniform pattern of emitters 204. For example, the selected emitters 204 may not form a random pattern based on having been selected from the non-random pattern of emitters 204, and may have no discernable pattern (e.g., such that selected emitters 204 do not form rows and columns that include similar quantities of emitters 204, do not form a pattern that has a particular shape, and/or the like)). As such, the first group of emitters 204 and the second group of emitters 204 may additionally have corresponding non-uniform patterns of emitters 204 after selection of the third group of emitters 204. Based on including three non-uniform patterned emitters 204, the emitter array shown with respect to reference number 420 may have sufficient variability in patterns of the emitters 204 between the different groups of emitters 204 to reduce or eliminate sensing issues that may occur with the emitter array shown with respect to reference number 410 due to that emitter array including two groups of emitters 204 that have similar patterns of emitters 204 (e.g., a perfectly uniform pattern, when repeated, may be difficult to locate, whereas a non-uniform pattern may be easier to locate). In some cases, including one or more additional groups of emitters 204 in the emitter array shown with respect to reference number 420 may further reduce or eliminate sensing issues.

A quantity and/or location of emitters 204 selected for inclusion in the third group of emitters 204 may depend on emitter-to-emitter distances of inter-group and intra-group emitters 204 before and after selection of the emitters 204 for the third group of emitters 204. For example, a threshold quantity of emitters 204 may need to be selected such that a first minimum emitter-to-emitter distance between two adjacent emitters 204 of the emitter array is greater than a second minimum emitter-to-emitter distance between two adjacent emitters 204 of any one of the groups of emitters 204, similar to that described elsewhere herein. In the examples shown in FIG. 4, groups of emitters 204 being chosen from among diagonal emitters 204 of entire set of emitters 204 in the emitter array means a minimum emitter-to-emitter distance between emitters 204 in a given group of emitters is a $\sqrt{2}$ equal or greater than a minimum emitter-to-emitter distance among emitters in the entire set of emitters 204 of the emitter array. It is apparent this relation is true when considering the center-to-center to distance between neighboring emitters because the length along the diagonal between neighboring emitter centers is $\sqrt{2}$ longer than the horizontal or vertical center to center spacing. When considering the distance (gap) between emitters (e.g., which equals the center-to-center spacing less the emitter diameter), the ratio becomes larger than $\sqrt{2}$ because each distance is smaller by a fixed amount.

As indicated above, FIG. 4 is provide merely as an example. Other examples may differ from what is described with regard to FIG. 4.

Notably, while particular examples of intra-group patterns and overall emitter array patterns are shown and described in FIGS. 2A-2D, 3, and 4, other examples are possible. For example, emitters 204 of an emitter array may form a non-random pattern of emitters 204 with irregular emitter-to-emitter spacing (e.g., a parabolic grid), a non-random pattern of emitters 204 with regular emitter-to-emitter spacing, a random pattern with regular emitter-to-emitter spacing, and/or the like. In general, emitters 204 of a given emitter array may have any combination of pattern and spacing described herein.

Figure 5:
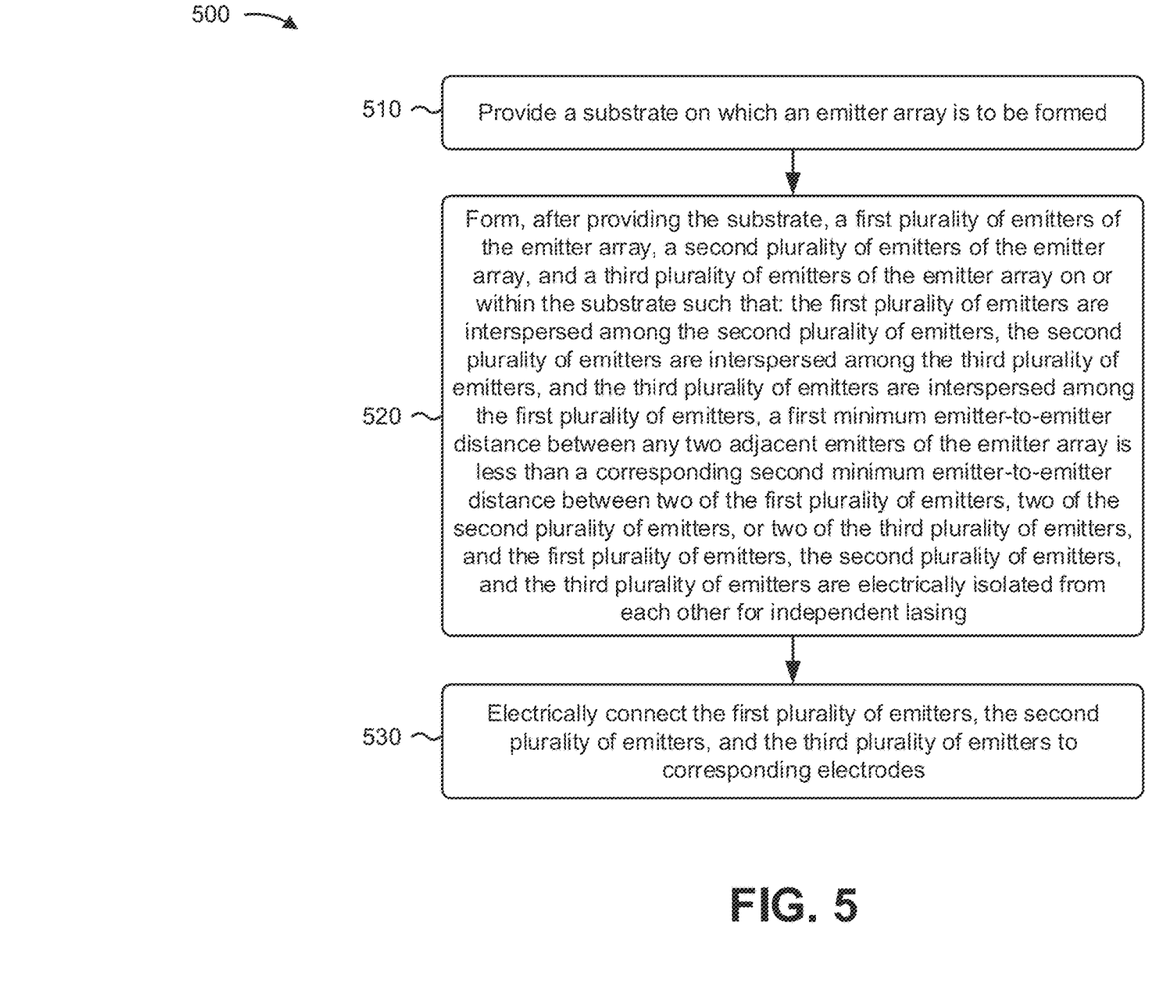
FIG. 5 is a flow chart of an example process for forming an emitter array with multiple groups of interspersed emitters.

FIG. 5 is a flow chart of an example process 500 for forming an emitter array with multiple groups of interspersed emitters 204. For example, FIG. 5 shows an example process 500 for manufacturing an emitter array on die 202 as described above.

As shown in FIG. 5, process 500 may include providing a substrate on which an emitter array is to be formed (block 510). For example, process 500 may include providing a die (e.g., die 202) on which an emitter array (e.g., a laser array) is to be formed. The substrate may include a gallium arsenide (GaAs) substrate and/or the like. The substrate may be separated from a wafer (e.g., a GaAs wafer) prior to forming the emitter array on the substrate.

As further shown in FIG. 5, process 500 may include forming, after providing the substrate, a first plurality of emitters of the emitter array, a second plurality of emitters of the emitter array, and a third plurality of emitters of the emitter array on or within the substrate (block 520). For example, process 500 may include forming a first plurality of emitters (e.g., a first group of emitters 204), a second plurality of emitters (e.g., a second group of emitters 204), and a third plurality of emitters (e.g., a third group of emitters 204) on or within the substrate after providing the substrate. To form a plurality of emitters, various epitaxial layers may be formed on the substrate. The plurality of emitters may be formed in a pattern, such as a two-dimensional pattern (e.g., a grid pattern, a hexagonal pattern, a random pattern, a non-uniform pattern, and/or the like).

In some implementations, the first plurality of emitters, the second plurality of emitters, and the third plurality of emitters may be formed such that emitters of the first plurality of emitters are interspersed among the second plurality of emitters, emitters of the second plurality of emitters are interspersed among the third plurality of emitters, and emitters of the third plurality of emitters are interspersed among the first plurality of emitters. For example, an emitter from the first plurality of emitters may be adjacent to one or more emitters from the second plurality of emitters and the third plurality of emitters, and likewise for the second plurality of emitters and the third plurality of emitters.

In some implementations, the first plurality of emitters, the second plurality of emitters, and the third plurality of emitters may be formed such that a first minimum emitter-to-emitter distance between any two adjacent emitters of the emitter array is less than a corresponding second minimum emitter-to-emitter distance between two of the first plurality of emitters, two of the second plurality of emitters, or two of the third plurality of emitters. For example, a first minimum emitter-to-emitter distance between any two adjacent emitters of the emitter array may be less than a second minimum emitter-to-emitter distance between two emitters for any of the first plurality of emitters, the second plurality of emitters, and the third plurality of emitters. As a specific example, a product of the first minimum emitter-to-emitter distance and a value equal to at least a square root of two may be less than the second minimum emitter-to-emitter distance.

In some implementations, the first plurality of emitters, the second plurality of emitters, and the third plurality of emitters may be formed such that the first plurality of emitters, the second plurality of emitters, and the third plurality of emitters are electrically isolated from each other for independent lasing. For example, a plurality of emitters may be associated with a metallization layer (e.g., a gold metallization layer, a silver metallization layer, a copper metallization layer, and/or the like) that is electrically isolated from other metallization layers corresponding to other pluralities of emitters. In addition, the emitter array may be associated with electrodes (e.g., electrodes 206) that provide electrical connections to the first plurality of emitters, the second plurality of emitters, and the third plurality of emitters, and the electrodes may provide electrical power to the corresponding pluralities of emitters independently.

In some implementations, the first plurality of emitters, the second plurality of emitters, and the third plurality of emitters may be formed in corresponding patterns, and the resulting emitter array may have a pattern of emitters formed from the corresponding patterns. For example, the first plurality of emitters, the second plurality of emitters, and the third plurality of emitters may be formed in a random pattern of emitters such that the emitter array has a random pattern of emitters, similar to that described with respect to FIGS. 2A-2D. Additionally, or alternatively, and as another example, the first plurality of emitters, the second plurality of emitters, and the third plurality of emitters may be formed in a non-random pattern of emitters such that the emitter array has a non-random pattern of emitters with an irregular spacing between emitters of the emitter array, similar to that described with respect to FIG. 3. Additionally, or alternatively, and as another example, the first plurality of emitters, the second plurality of emitters, and the third plurality of emitters may be formed in a non-uniform pattern of emitters such that the emitter array has a non-random pattern of emitters, similar to that described with regard to FIG. 4.

As further shown in FIG. 5, process 500 may include electrically connecting the first plurality of emitters, the second plurality of emitters, and the third plurality of emitters to corresponding electrodes (block 530). For example, process 500 may include electrically connecting the first plurality of emitters, the second plurality of emitters, and the third plurality of emitters to corresponding electrodes after forming the first plurality of emitters, the second plurality of emitters, and the third plurality of emitters. Electrically connecting the first plurality of emitters, the second plurality of emitters, and the third plurality of emitters to the corresponding electrodes may include forming metallization layers corresponding to the first plurality of emitters, the second plurality of emitters, and the third plurality of emitters on the emitter array to electrically connect the first plurality of emitters, the second plurality of emitters, and the third plurality of emitters to the corresponding anodes. For example, the metallization layers may be electrically isolated from each other to facilitate independent powering and/or lasing of different pluralities of emitters.

In some implementations, forming the first plurality of emitters, the second plurality of emitters, and the third plurality of emitters may include forming each of the first plurality of emitters, the second plurality of emitters, and the third plurality of emitters such that the emitter array has a random pattern of emitters.

In some implementations, forming the first plurality of emitters, the second plurality of emitters, and the third plurality of emitters may include forming each of the first plurality of emitters, the second plurality of emitters, and the third plurality of emitters in a non-random pattern such that the emitter array has a non-random pattern of emitters with an irregular spacing between emitters.

In some implementations, forming the first plurality of emitters, the second plurality of emitters, and the third plurality of emitters may include forming each of the first plurality of emitters, second plurality of emitters, and the third plurality of emitters in a non-uniform pattern of emitters such that the emitter array has a non-random pattern of emitters.

In some implementations, forming the first plurality of emitters, the second plurality of emitters, and the third plurality of emitters may include forming the first plurality of emitters, the second plurality of emitters, and the third plurality of emitters such that a product of the first minimum emitter-to-emitter distance and a value equal to at least a square root of two is less than the second minimum emitter-to-emitter distance.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein the term "layer" is intended to be broadly construed as one or more layers and includes layers oriented horizontally, vertically, or at other angles.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. An optical device comprising:
    an emitter array consisting of a plurality of emitter groups,
        each emitter group being independently addressable from other emitter groups, of the plurality of emitter groups, for independently lasing, and
        emitters of the plurality of emitter groups being interspersed within the emitter array such that:
            a minimum emitter-to-emitter distance within the emitter array is less than a minimum emitter-to-emitter distance within any of the plurality of emitter groups, and
            no two emitters, of a same group of the plurality of emitter groups, are nearest neighbors.

2. The optical device of claim 1, wherein a product of the minimum emitter-to-emitter distance within the emitter array and a value equal to at least a square root of two is less than the minimum emitter-to-emitter distance within any of the plurality of emitter groups.

3. The optical device of claim 1, wherein the minimum emitter-to-emitter distance within any of the plurality of emitter groups is selected to avoid overlap of emission spots at a particular depth of field when lasing only one of the plurality of emitter groups.

4. The optical device of claim 1, further comprising:
    a plurality of electrodes, each providing an electrical connection to a respective one of the plurality of emitter groups, wherein each of the plurality of electrodes is configured to provide electrical power to a respective one of the plurality of emitter groups and independently from other electrodes of the plurality of electrodes.

5. The optical device of claim 1, wherein an emitter group, of the plurality of emitter groups, has at least one of a non-random pattern within the emitter array or irregular spacing among emitters of the emitter group.

6. The optical device of claim 1, wherein the emitter array has a non-random pattern of emitters formed from the plurality of emitter groups.

7. An optical device, comprising:
an emitter array consisting of a plurality of emitter groups,
wherein emitters of the plurality of emitter groups are interspersed within the emitter array such that;
a minimum emitter-to-emitter distance within the emitter array is less than a minimum emitter-to-emitter distance within any of the plurality of emitter groups, and
no two emitters, of a same group of the plurality of emitter groups, are nearest neighbors, and
wherein each emitter group of the plurality of emitter groups is independently addressable for independent lasing; and
a plurality of electrodes that each provide an electrical connection to a respective one of the plurality of emitter groups.

8. The optical device of claim 7, wherein a product of the minimum emitter-to-emitter distance within the emitter array and a value equal to at least a square root of two is less than the minimum emitter-to-emitter distance within any of the plurality of emitter groups.

9. The optical device of claim 7, wherein the minimum emitter-to-emitter distance within any of the plurality of emitter groups is selected to avoid overlap of emission spots at a particular depth of field when lasing only one of the plurality of emitter groups.

10. The optical device of claim 7,
wherein the plurality of electrodes are configured to provide electrical power to each of the plurality of emitter groups, respectively and independently from each other.

11. The optical device of claim 7, wherein each of the plurality of emitter groups has a non-random pattern within the emitter array.

12. The optical device of claim 7,
wherein the emitter array has a non-random pattern of emitters with an irregular spacing between emitters of the emitter array.

13. The optical device of claim 7, wherein each of the plurality of emitter groups has a non-uniform pattern of emitters, and
wherein the emitter array has a non-random pattern of emitters formed from the plurality of emitter groups.

14. A vertical cavity surface emitting laser (VCSEL) array, consisting of:
a plurality of groups of VCSELs,
wherein VCSELs of the plurality of VCSELs are interspersed within the VCSEL array,
wherein no two VCSELs, of a same group of the plurality of groups of VCSELs, are nearest neighbors,
wherein a minimum emitter-to-emitter distance within the VCSEL array is less than a minimum emitter-to-emitter distance within any of the plurality of groups of VCSELs, and
wherein the VCSEL array is configured such that the plurality of groups of VCSELs are capable of lasing independently of each other.

15. The VCSEL array of claim 14, wherein a product of the minimum emitter-to-emitter distance within the VCSEL array and a value equal to at least a square root of two is less than the minimum emitter-to-emitter distance within any of the plurality of groups of VCSELs.

16. The VCSEL array of claim 14, wherein the plurality of groups of VCSELs are capable of lasing at different times.

17. The VCSEL array of claim 14, further comprising:
electrodes providing electrical connections to the plurality of groups of VCSELs,
wherein the electrodes are configured to provide electrical power independently from each other.

18. The VCSEL array of claim 14, wherein patterns of VCSELs corresponding to the plurality of groups of VCSELs are different than a pattern of VCSELs for the VCSEL array.

19. The VCSEL array of claim 18, wherein the patterns of VCSELs are non-uniform patterns of VCSELs and the pattern of VCSEL is a non-random pattern of VCSELs.

20. The VCSEL array of claim 14, wherein the minimum emitter-to-emitter distance within any of the plurality of groups of VCSELs is selected to avoid overlap of emission spots of VCSELs at a particular depth of field when lasing only one of the plurality of groups of VCSELs.

* * * * *